United States Patent
Makino

[11] Patent Number: 5,984,500
[45] Date of Patent: Nov. 16, 1999

[54] REMOTE CONTROLLER

[75] Inventor: Hideo Makino, Daito, Japan

[73] Assignee: Funai Electric Company Limited, Osaka, Japan

[21] Appl. No.: 08/396,184

[22] Filed: Feb. 24, 1995

Related U.S. Application Data

[63] Continuation of application No. 08/171,895, Dec. 22, 1993, abandoned, which is a continuation of application No. 07/946,005, Sep. 15, 1992, abandoned, which is a continuation of application No. 07/865,823, Apr. 1, 1992, abandoned, which is a continuation of application No. 07/660,965, Feb. 26, 1992, abandoned, which is a continuation of application No. 07/461,735, Jan. 8, 1990, abandoned.

[30] Foreign Application Priority Data

May 12, 1989 [JP] Japan ........................... 1-54997

[51] Int. Cl.⁶ ............................. H03J 5/10; H03J 9/06; F24F 11/00; H04L 29/00
[52] U.S. Cl. ................................... 364/143; 341/176
[58] Field of Search ................... 354/105; 358/194.1; 364/143

[56] References Cited

U.S. PATENT DOCUMENTS

| | | |
|---|---|---|
| 4,325,081 | 4/1982 | Abe et al. .............................. 455/231 |
| 4,386,436 | 5/1983 | Kocher et al. ....................... 455/151.4 |
| 4,449,805 | 5/1984 | Sakurada et al. ...................... 396/318 |
| 4,450,487 | 5/1984 | Koide ..................................... 386/118 |
| 4,561,049 | 12/1985 | Deleganes et al. .................... 364/188 |
| 4,755,883 | 7/1988 | Uehira ..................................... 386/83 |
| 4,816,635 | 3/1989 | Edamura ................................ 341/176 |
| 4,841,368 | 6/1989 | Rumbolt et al. ....................... 348/734 |
| 4,855,746 | 8/1989 | Stacy ..................................... 341/176 |
| 4,878,055 | 10/1989 | Kasahara .................................. 341/23 |
| 4,885,579 | 12/1989 | Sandbank ........................... 340/825.72 |
| 4,890,108 | 12/1989 | Drori et al. ............................ 341/176 |
| 4,899,370 | 2/1990 | Kameo et al. ......................... 235/375 |

FOREIGN PATENT DOCUMENTS

| | | |
|---|---|---|
| 0083466 | 5/1984 | Japan . |
| 0274547 | 12/1986 | Japan . |
| 0046806 | 2/1989 | Japan . |
| 0166694 | 6/1989 | Japan . |

Primary Examiner—Robert W. Downs
Attorney, Agent, or Firm—Jordan & Hamburg LLP

[57] ABSTRACT

A remote controller for setting timer programming items wherein a display section is constructed in such manner that display items are provided in parallel with mechanical rotary switches, the distance between the rotary switches and their displays is adjacent and the relation between them becomes one to one correspondence, whereby an operator manipulates operational switches without making mistakes while looking at display items corresponding to the operational switches.

3 Claims, 3 Drawing Sheets

5,984,500

REMOTE CONTROLLER

This application is a continuation of application Ser. No. 08/171,895 filed Dec. 22, 1993, now abandoned, which in turn, is a continuation of application Ser. No. 07/946,005 filed Sep. 15, 1992, abandoned, which in turn, is a continuation of application Ser. No. 07/865,823, filed Apr. 1, 1992, now abandoned, which, in turn, is a continuation of application Ser. No. 07/660,965 filed Feb. 26, 1991, now abandoned, which in turn, is a continuation of application Ser. No. 07/461,735 filed Jan. 8, 1990, now abandoned.

BACKGROUND OF THE INVENTION

1. Field of the Invention

The present invention relates to a remote controller for controlling electrical systems such as a television, a video tape recorder (hereinafter referred as to VTR), an air conditioner and the like at hand, away from a main control unit of an electric appliance.

2. Description of the Prior Art

In such a remote controller, for example, the remote controller for a VTR is used to timer-program video recording of television broadcasts. And, in such timer programming, there are a type of system wherein a display section is provided on the remote controller and the setting of operation items is performed as looking at the operation items displayed on the display section and thereafter the settings being transferred to the main control unit, and another type of system wherein the operation items are displayed on a screen of a television and the setting is performed by using a remote controller.

However, in the conventional remote controllers referred to, the display section is designed to display various kinds of display items by switching over, and when setting the timer programming of television broadcasts, the setting contents are inputted while changing the various kinds of display items. In this manner, the display section changeably displays a plural of display items so that the relation between the switching operation and its display does not become one to one correspondence. Further, because most remote controllers employ push bottoms, in operating the push buttons, both the action of inputting ascending values and that of inputting descending values are performed by the same action of pressing the push buttons. Therefore, when setting values such as hours while putting a timer for timer programing forward or back by pressing push buttons, there is the case that thinking for operating does not become coincident with operation. This causes the operation to be complicated and the remote controller to be difficult to operate and then, it takes long time to be familiar with its operation. Furthermore, there is such problem that because of a mistake of timer programming, the video recording of television broadcasts at a pre-set time does not carry out satisfactorily.

SUMMARY OF THE INVENTION

It is an object of the present invention to provide a remote controller with which it is easy for even an unskilled operator to set timer program, because the operating switches for setting timer programming of a VTR and the like are arranged to make adjacent to their displays and to become one to one toward their displays.

Further, it is another object of the present invention to provide a remote controller which prevent an operator from making mistakes about manipulating the operating switches in inputting set values, because, when applying them to rotary switches, manipulating action for inputting ascending values becomes reverse to that for inputting descending values so that thinking for operating becomes coincident with operation.

According to the present invention, in a remote controller for outputting various kinds of instructive signals at distance from a main body of a system, there are provided mechanical rotary switches for setting plural timer programming items or controlling items, a display section for displaying setting values corresponding to said rotary switches, and a transfer switch for producing an instruction for transferring signals concerned with the setting values.

Thus according to the present invention, desired setting contents are inputted by operating the rotary switches for every setting items as looking at the timer programming items or the controlling items displayed on the display section, and thereafter data of the setting contents may be transferred to the main control unit of the system. Thus even an unskilled operator may input setting contents without making mistakes.

DESCRIPTION OF THE PREFERRED EMBODIMENT

Figure 1:
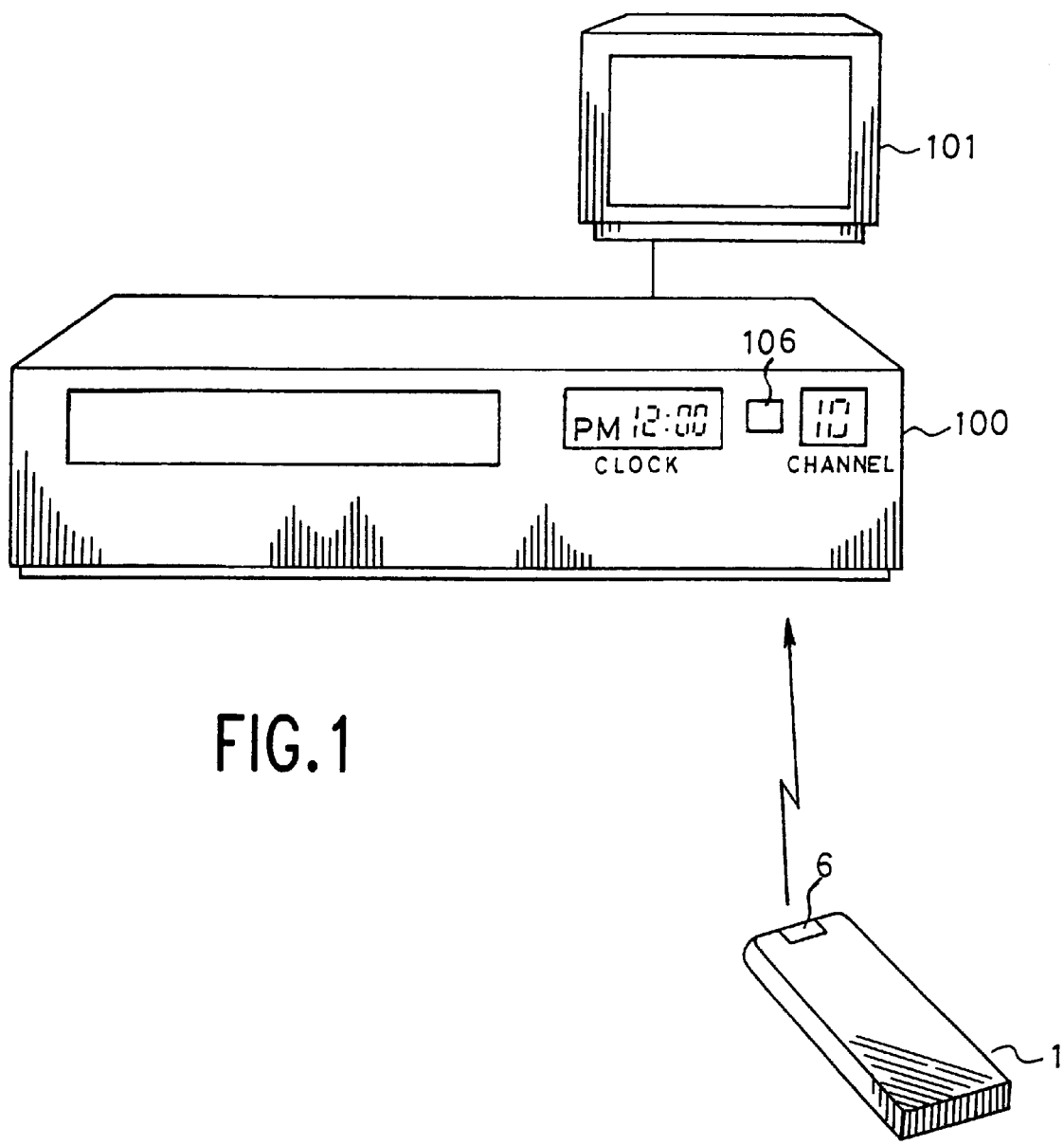
FIG. 1 is a schematic illustration of a VTR system using a remote controller according to a preferred embodiment of the invention.

Now, embodiments of the present invention will be described bellow with reference to the appended drawings wherein a remote controller is applied for a VTR system. A schematic illustration of such a VTR system is shown in FIG. 1 consisting a remote controller, a main control unit 100 of the VTR, and a television 101. The remote controller 1 is used to set timer programs for video recording of television broadcasts at a pre-set time.

Figure 2:
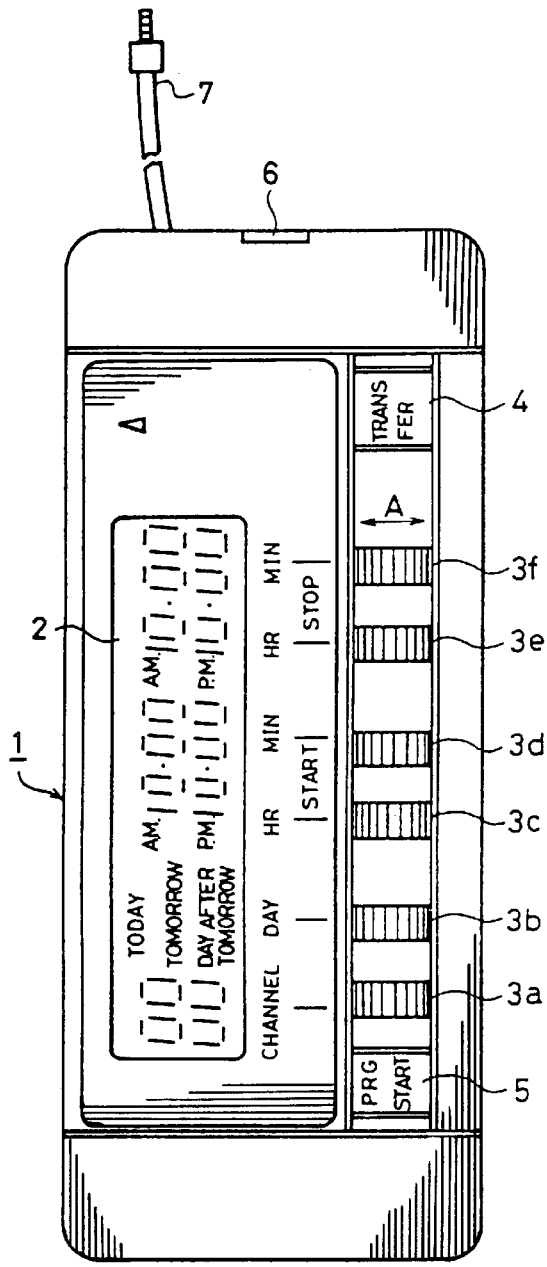
FIG. 2, FIG. 3, FIG. 4, and FIG. 5(a) are top plan views of a remote controller according to a preferred embodiment of the invention, respectively.

FIG. 2 shows a first embodiment of the remote controller. The remote controller 1 consists of a display section 2 displaying a channel number, a day including "today", "tomorrow", and "the day after tomorrow ", a starting time and minute of recording, and a stopping time and minute thereof, rotary switches 3a, 3b, 3c, 3d, 3e, and 3f, which are arranged in a row, adjacent to the display section 2 and with which the day of "today", "tomorrow", "the day after tomorrow", the starting hour and minute of recording, and the stopping time and minute thereof are set, a transfer switch 4 for producing an instruction for transferring signals implicating the setting contents to the main control unit 100 of the VTR, a start switch 5 for starting the setting of the timer programs, a infrared emitter 6 for transferring data to the main control unit by wireless, and a cable 7 for transferring them thereto by wire. The display section 2 is made of a LCD (liquid crystal display) and constructed in such manner that the display items are provided in parallel with the rotary switches 3a–3f. Displaying the current setting contents are left until inputting the next setting contents. As to said means for transferring data, it has only to be provided at least either one of the wireless or wire means.

Further, however as not shown, the remote controller 1 includes a driving circuit for displaying the setting contents with the LCD and a electronic circuit for generating signals of data to be transferred to the main control unit 100 of the VTR.

In the remote controller arranged as described, the setting of desired timer programming items is performed by turning the rotary switches 3a, 3b, 3c, 3d, 3e, and 3f in the direction of an arrow A, as confirming the displayed items on the display section 2 after depressing the start switch 5. For example, when recording the broadcast on channel 6 tomorrow from 8 p.m. to 9 p.m., each rotary switch is operated to set the display items on 6 channel, tomorrow, at 8 p.m., and at 9 p.m.

After betting the items, transferring the set data to the main control unit 100 of the VTR is performed by pressing the transfer switch 4. In case of transferring the data by wireless, the infrared emitter 6 for transferring data must be pointed to a acceptor 106 of the main control unit 100 of the VTR. While in case of by wire, the cable 7 for transferring data must be connected to the main control unit 100 thereof.

Moreover, the transferred data is left displaying on the display section 2 and after pressing the transfer switch 4, even if operating each rotary switch, the current setting contents might be designed to not change at once. Meanwhile the display section 2 might be arranged to automatically display only a clock display after passing the predetermined time.

Figure 3:
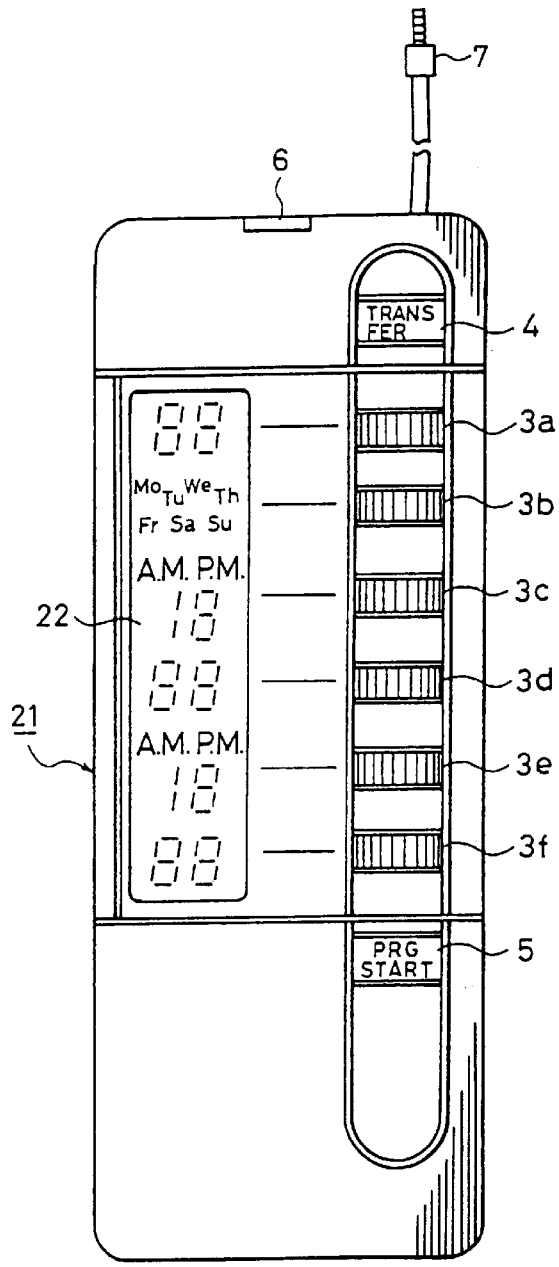

FIG. 3 shows a second embodiment of the remote controller.

With reference to FIG. 3, in which parts similar to those previously described with reference to FIG. 2 are denoted by the same reference numerals, the construction of a display 22 on a remote controller 21 of the embodiment is different from that of the first embodiment. The display section 2 of the former embodiment displays "today", "tomorrow", and "the day after tomorrow", while, the display section 22 of latter ones displays days of "Monday", "Tuesday", "Wednesday", "Thursday", "Friday ", "Saturday", and "Sunday", setting a recording day on a day of the week can be performed by the controller 21 of this embodiment.

Figure 4:
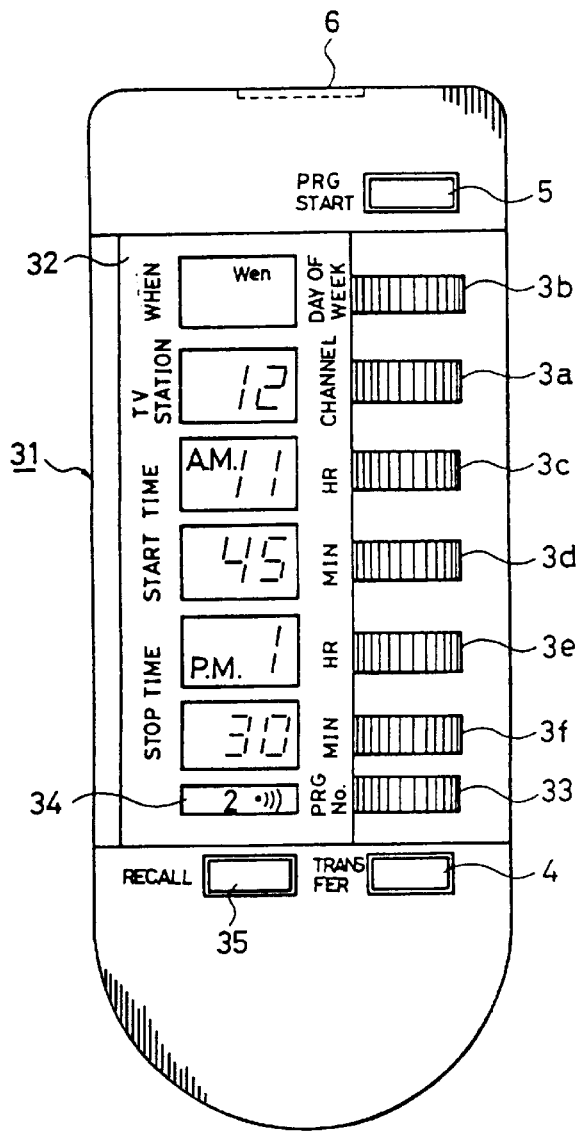

FIG. 4 shows a third embodiment of the remote controller.

In comparison with the second embodiment, a remote controller 31 of the embodiment differs from the remote controller 21 on the construction of the display items, the number of the switches, and the number of the rotary switches. In this embodiment, a display section 32 displays a day of the week, a channel number, a starting hour and minute of recording, a stopping hour and minute of recording, and also a display portion 34 displays a program number, which is selected by a rotary switch 33 for plural timer programmings. Further, there is provided a recalling switch 35 for confirming the current setting contents.

In the present embodiment, a program number display 34 displays a program number selected by the rotary switch 33 for plural timer programmings and plural timer programmings can be set by selecting the program numbers.

Figure 5A:
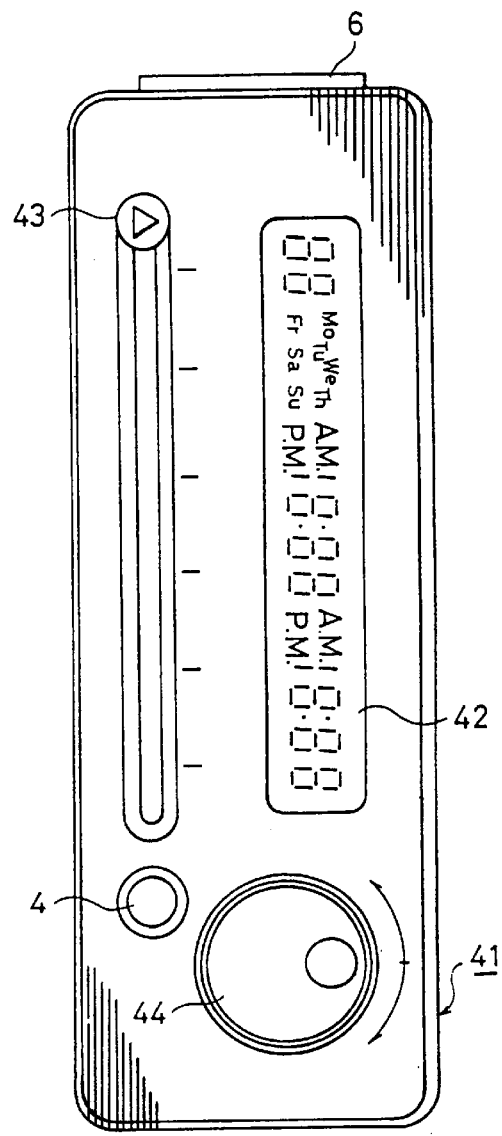
Figure 5B:
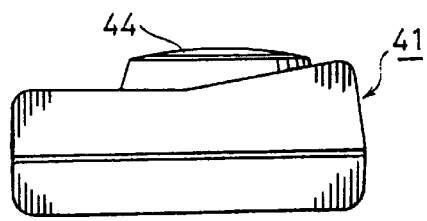
FIG. 5(b) is a side elevation view of a remote controller shown in FIG. 5(a).

FIG. 5 shows a forth embodiment of the remote controller.

This embodiment have a different display section and type of switches from the above embodiments. In a remote controller 41 of this embodiment, items of a display section 42 are selected by a select switch 43. In each of selected items, desired contents (i.e. data) may be set by operating a rotary switch 44 and the data of selected items is transferred to the main control unit 100 of the VTR by the transfer switch 4. In the present embodiment, the number of switch members can be reduced.

The invention has been described with reference to preferred embodiments. However, it will be appreciated that variations and modifications can be effected with the ordinary skill in the art without departing from the scope of the invention. For example, when a receive circuit for receiving signals from the main control unit is built in a remote controller body, the inputting of setting contents may be performed in an interactive data entry because of receiving a answer call from the main control unit of the VTR. Further, a remote controller according to the present invention is applicable to the timer programming of audio systems, that of temperature, humidity, and ON-OFF setting of an air conditioner and the like.

What is claimed is:

1. A remote controller for outputting timing and control signals to a video recorder comprising:

a start switch for starting a program sequence in which the controller can be programmed;

a display means for displaying data having a plurality of display areas, arranged in a row, for displaying items of data to be entered into the controller for transmission into the video recorder, the items of data including channel number, date or day of the week, and recording start and finish time;

rotary switches, arranged in a row parallel to the row of display areas, for setting data displayed in respective corresponding ones of said display areas;

each of said rotary switches being positionally aligned with said respective corresponding ones of said display areas;

control means for enabling entry of data in said display areas by operation of said rotary switches in response to operation of said start switch;

a transfer switch for transferring a control signal to the video recorder, the control signal including data entered in response to operation of said start switch; and said control means including means for maintaining said data entered in said display areas after operation of said transfer switch despite operation of said rotary switches.

2. The remote controller of claim 1 wherein said display means further includes a display area which indicates a program number, and said plurality of rotary switches includes a rotary switch in one-to-one correspondence with said display area corresponding to said program number, wherein any of a plurality of different programs can be accessed.

3. A remote control device comprising:

display means for displaying data;

said display means having data display areas for displaying data of respective types associated with individual ones of said display areas;

first user input means having individual data entry devices in positional alignment with respective ones of said display areas for setting data displayed in said respective ones of said display areas;

a second user input means for initiating the setting of the data displayed by said display means;

control means for enabling entry of data in said display means by operation of said first user input means in response to operation of said second user input means;

a transfer switch for transferring a control signal to the video recorder, the control signal including data entered in response to operation of said second user input means; and said control means including means for maintaining said data entered in said display areas after operation of said transfer switch despite operation of said first user input means.

* * * * *

UNITED STATES PATENT AND TRADEMARK OFFICE
CERTIFICATE OF CORRECTION

PATENT NO. : 5,984,500
DATED : November 16, 1999
INVENTOR(S) : Hideo MAKINO

It is certified that error appears in the above-indentified patent and that said Letters Patent is hereby corrected as shown below:

On the title page, item [63]:

In "Related U.S. Application Data" on the first page of the patent, correct the filing date of application No. 07/660,965 to February 26, 1991.

Signed and Sealed this

Nineteenth Day of September, 2000

Attest:

Q. TODD DICKINSON

Attesting Officer

Director of Patents and Trademarks